(12) United States Patent
Ochs

(10) Patent No.: US 6,795,959 B1
(45) Date of Patent: Sep. 21, 2004

(54) INTEGRATED DELAY DISCRIMINATOR FOR USE WITH A FIELD-PROGRAMMABLE GATE ARRAY AND A METHOD OF DETERMINING A TIME DELAY THEREOF

(75) Inventor: Christopher D. Ochs, Emmaus, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 43 days.

(21) Appl. No.: 10/103,100

(22) Filed: Mar. 21, 2002

(51) Int. Cl.[7] .............................................. G06F 17/50
(52) U.S. Cl. ................................. 716/16; 716/1; 716/6
(58) Field of Search ...................... 716/1–6, 10, 16–18; 714/725; 327/149, 151, 158–159, 160–162; 326/39–40

(56) References Cited

U.S. PATENT DOCUMENTS

| | | | | |
|---|---|---|---|---|
| 5,309,428 A | * | 5/1994 | Copley et al. .............. | 370/245 |
| 5,333,154 A | * | 7/1994 | Hengeveld et al. ......... | 375/354 |
| 5,381,348 A | * | 1/1995 | Ernst et al. ................. | 324/534 |
| 5,815,016 A | * | 9/1998 | Erickson ..................... | 327/158 |
| 6,091,671 A | * | 7/2000 | Kattan ........................ | 368/113 |
| 6,130,552 A | * | 10/2000 | Jefferson et al. .............. | 326/39 |
| 6,157,231 A | * | 12/2000 | Wasson ...................... | 327/156 |
| 6,594,797 B1 | * | 7/2003 | Dudley et al. .............. | 714/815 |

* cited by examiner

Primary Examiner—Vuthe Siek
Assistant Examiner—Paul Dinh

(57) ABSTRACT

An integrated delay discriminator for use with a field-programmable gate array including a reference path and a response path. The reference path is associated with a first delay of a first portion of the field-programmable gate array, and is configured to provide an event initiation marker for opening a delay measurement window. The response path is coupled to the reference path and is associated with a second delay of a second portion of the field-programmable gate array. The response path is configured to provide an event termination marker for closing the delay measurement window that was opened by the reference path. This allows a time delay determination measurement between the first portion and the second portion of the field-programmable gate array.

10 Claims, 3 Drawing Sheets

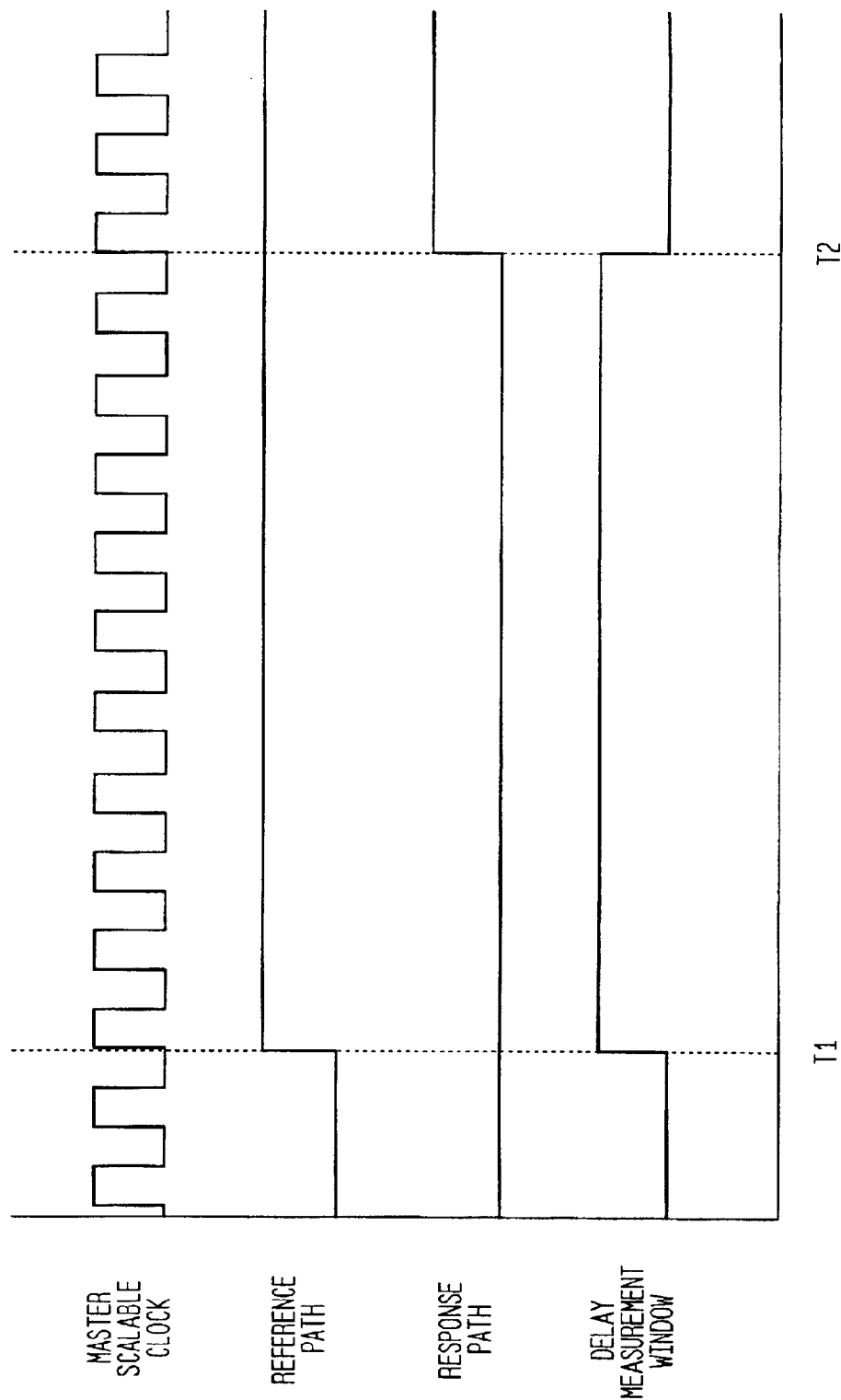

INTEGRATED DELAY DISCRIMINATOR FOR USE WITH A FIELD-PROGRAMMABLE GATE ARRAY AND A METHOD OF DETERMINING A TIME DELAY THEREOF

TECHNICAL FIELD OF THE INVENTION

The present invention is directed, in general, to programmable logic devices and, more specifically, to a system and method of determining a time delay of circuitry associated with a field-programmable gate array.

BACKGROUND OF THE INVENTION

Integrated circuits are well known and are extensively used in various present day technological devices and systems, such as sophisticated telecommunications and computer systems. Typically, Application Specific Integrated Circuits (ASICs) provide logic networks for various devices wherein the application has been fully tested. Programmable Logic Devices (PLDs), however, are becoming more widely used, as well.

PLDs are a class of general-purpose chips that can be configured for a wide variety of applications. PLDs include logic devices such as an array of AND gates connected to an array of OR gates. A Field-Programmable Gate Array (FPGA) is a type of PLD that may be advantageously employed to implement tailored logic circuits. In FPGAs, the interconnects between the various elements are designed to be user programmable.

PLDs in general, and FPGAS more specifically, will perform the functions of a custom ASIC but allow more flexibility. In fact, the most significant advantage of using FPGAs is the ability to produce a prototype logic design, and then implement it in silicon, shortly thereafter. An ASIC, however, can take months and many dollars to develop before finally producing a working silicon implementation. Since the introduction of the FPGA in the early 1980s, FPGAs have continued to increase in useable gate count while decreasing in price. Understandably, the decrease in cost along with their design flexibility have made the FPGA a popular choice among engineers and designers.

While considered an advantage, the flexibility of an FPGA can also create a problem when determining the actual delay of a specific circuit implemented within an FPGA. Though determining the delay for an ASIC may also be a concern, the implemented designs have typically undergone extensive testing since they are usually mass produced. This allows the results of one test to be applied to multiple copies of an ASIC. The circuits employed in FPGAs, however, are not mass-produced to the extent of ASICs. Critical circuit portions within an FPGA, therefore, may need to be tested in order to determine actual delays.

While testing can be performed on FPGAs, there are a couple of drawbacks. First, measuring the delay of an FPGA circuit typically requires the use of equipment such as automatic test equipment, vector generators, oscilloscopes, or other complex test equipment. In addition to requiring extensive equipment, determining the delay of a circuit within an FPGA also may require extensive time to set up and dismantle the test equipment.

Second, the needed external test equipment may create delays in addition to the circuit being tested within the FPGA. The intrinsic delays of each piece of equipment along with the effect of their interconnecting leads must be removed from the measured delays to obtain the actual delay of the circuit being tested. These measurements become more problematical when the circuit is tested at higher frequency, since the intrinsic delay may become a larger portion of the delay measurement.

Accordingly, what is needed in the art is a system and method that determines the delay of a circuit within an FPGA without requiring expensive test equipment and creating additional intrinsic delays.

SUMMARY OF THE INVENTION

To address the above-discussed deficiencies of the prior art, the present invention provides an integrated delay discriminator for determining a time delay for use with a field-programmable gate array. In one embodiment, the integrated delay discriminator includes a reference path, associated with a first delay of a first portion of the field-programmable gate array and a response path, coupled to the reference path and associated with a second delay of a second portion of the field-programmable gate array. The reference path is configured to provide an event initiation marker for opening a delay measurement window and the response path is configured to provide an event termination marker for closing the delay measurement window thereby allowing a time delay determination measurement between the first portion and the second portion of the field-programmable gate array.

In another aspect, the present invention provides a method of determining a time delay associated with a field-programmable gate array that includes initiating an event initiation marker along a reference path for opening a delay measurement window, receiving an event termination marker along a response path for closing the delay measurement window and providing a time delay determination measurement between the event initiation and the event termination markers.

In another aspect, the present invention provides a field-programmable gate array that includes an integrated delay discriminator and provides a time delay determination measurement between first and second circuits of a field-programmable gate array having first and second time delays, respectively. The integrated delay discriminator includes a reference path and a response path. The reference path, associated with the first circuit, provides an event initiation marker for opening a delay measurement window, and the response path, coupled to the reference path and associated with the second circuit, provides an event termination marker for closing the delay measurement window.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 3 illustrates a timing diagram of an embodiment of a method of determining a time delay of a circuit associated with a field-programmable gate array in accordance with the principles of the present invention.

DETAILED DESCRIPTION

Figure 1:
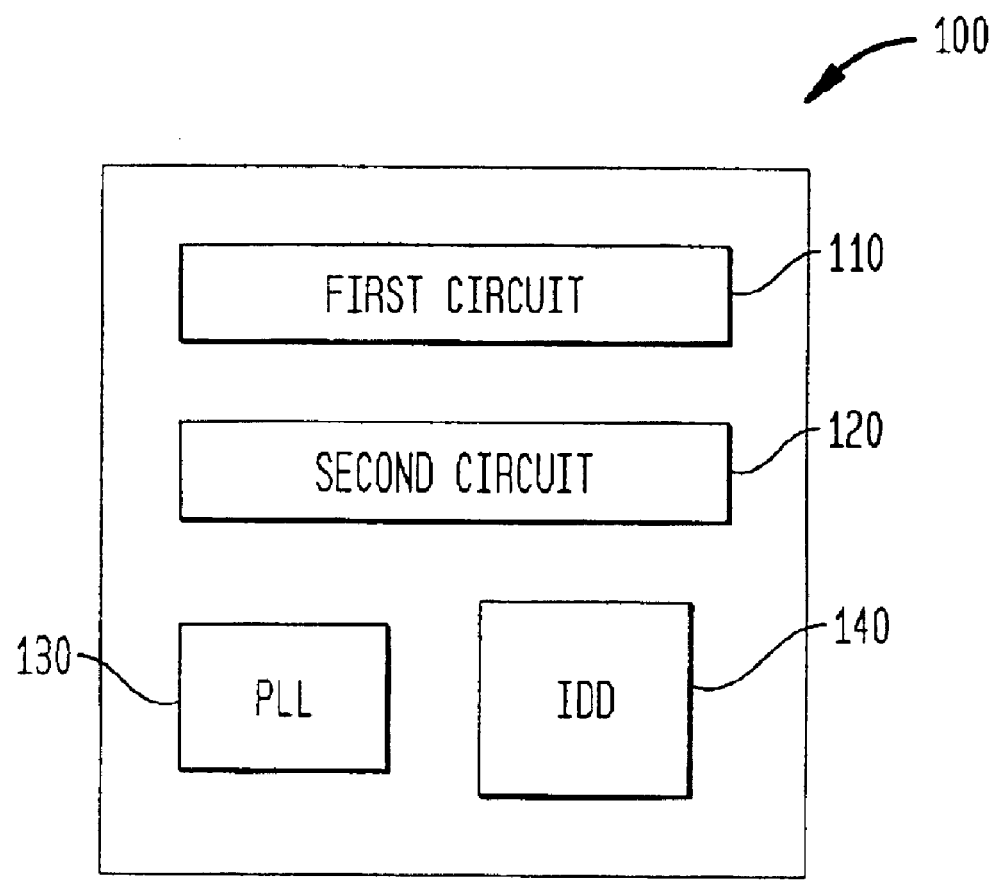
FIG. 1 illustrates a block diagram of an embodiment of a field-programmable gate array constructed in accordance with the principles of the present invention.

Referring initially to FIG. 1, illustrated is a block diagram of an embodiment of a field-programmable gate array, generally designated 100, constructed in accordance with the principles of the present invention. The field-programmable gate array 100 includes a first circuit 110, a second circuit 120, a phase locked loop 130, and an integrated delay discriminator 140. Of course, the field-programmable gate array 100 may contain other circuits or components that are not shown.

In general, the integrated delay discriminator 140 includes a reference path and a response path that is coupled to the reference path. In the illustrated embodiment, the reference path is associated with the first circuit 110 and the response path is associated with the second circuit 120. The reference path is configured to provide an event initiation marker for opening a delay measurement window. The response path, accordingly, is configured to provide an event termination marker for closing the delay measurement window. The integrated delay discriminator 140 provides an intrinsic delay (i.e., the delay solely afforded by or associated with the integrated delay discriminator 140 itself) that is negligible or insignificant compared to delays experienced on the reference or response paths.

In the illustrated embodiment, the first circuit 110 of the field-programmable gate array 100 is a single conductor or point of measurement, which provides a negligible or insignificant first delay. The second circuit 120 is a circuit portion of the field-programmable gate array 100, which provides a non-negligible second delay. In alternative embodiments, the first circuit 110 and the second circuit 120 may include one or more partial or complete circuits of the field-programmable gate array 100. For this case, the first and second delays would be overall or total delay times of the circuitry constituting the first circuit 110 and the second circuit 120, respectively. A relative delay may be determined as a difference between the first and second delays.

Using the delay measurement window, the field-programmable gate array 100 provides a time delay determination measurement between the first circuit 110 and the second circuit 120. In the illustrated embodiment, the time delay determination measurement window is provided by an XOR gate employed in the field-programmable gate array 100. In other embodiments, however, another logical device may be employed to provide the time delay determination measurement. In an exemplary embodiment, the time delay determination measurement is proportional to a period of a scalable master clock. In another embodiment, the field-programmable gate array 100 may include a counter circuit associated with a display that provides a count proportional to the time delay determination measurement. For more information regarding field-programmable gate arrays, see "Field-Programmable Gate Arrays" by Brown, Francis, Rose and Vranesic, 6th printing, Kluwer Academic Publishers (1992), which is incorporated herein by reference.

Though not specifically shown, the phase locked loop 130 may be coupled to a clock in the field-programmable gate array 100 to provide the scalable master clock. Typically, the clock may operate at a frequency around 66 megahertz. It is not uncommon, however, to have some portions of the field-programmable gate array 100 operating at a higher frequency than other portions of the field-programmable gate array 100. The phase locked loop 130 allows a scaling in the frequency of the clock to test the delay of, for instance, the second circuit 120 at a higher frequency. For example, using the phase locked loop 130, the frequency of the clock may be multiplied five or six times thereby yielding frequencies up to about 396 megahertz, which is then used to determine a delay associated with the second circuit 120.

As mentioned above, the first circuit 110 and the second circuit 120 may include one or more circuits within the field-programmable gate array 100. Further, the field-programmable gate array 100 may include other circuits or devices which are not included in the first circuit 110 or the second circuit 120. The field-programmable gate array 100, may also include more than one integrated delay discriminator. Additionally, one skilled in the pertinent art will understand that the integrated delay discriminator 140 may be added when the field-programmable gate array 100 is first constructed or the integrated delay discriminator 140 may be added to the field-programmable gate array 100 at a later time.

Figure 2:
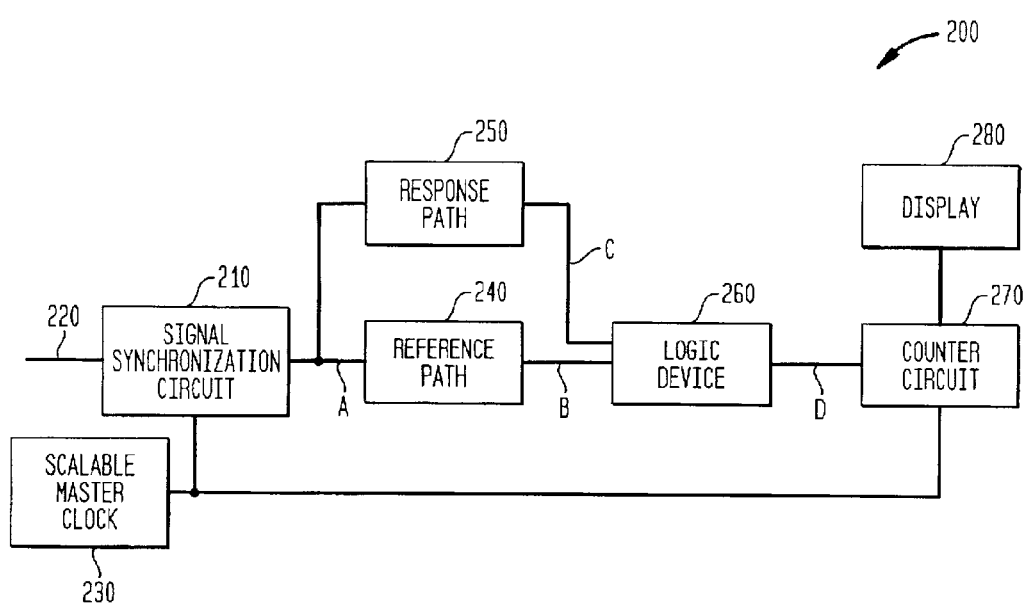
FIG. 2 illustrates a configuration diagram of an embodiment of an integrated delay discriminator constructed in accordance with the principles of the present invention.

Turning now to FIG. 2, illustrated is a configuration diagram of an embodiment of an integrated delay discriminator 200 constructed in accordance with the principles of the present invention. The integrated delay discriminator 200 includes a signal synchronization circuit 210 having a signal input 220, a scalable master clock 230, a reference path 240, a response path 250, a logic device 260, and a counter circuit 270 associated with a display 280.

In the illustrated embodiment, the signal input 220 provides a conventional two-level digital signal generated by a mechanical switch. In this embodiment, a closed position of the switch has been designated as an asserted or high level and provides a voltage step. In alternative embodiments, an open position of the switch may be designated as the asserted or high level. Instead of a mechanical switch, the signal input 220 may be derived from another conventional signal generator.

The signal synchronization circuit 210 receives the voltage step from the signal input 220 and is also coupled to the scalable master clock 230. The signal synchronization circuit 210 conditions the voltage step from the signal input 220 and synchronizes it with the scalable master clock 230. In this embodiment, the signal synchronization circuit 210 consists of two flip-flops that debounce the voltage step from the signal input 220 and provide a smooth transition between a low level and a high level, which is substantially free of signal jitter. In other embodiments, the signal synchronization circuit 210 may include other logic devices which provide a substantially clean and synchronized signal.

The scalable master clock 230 is also coupled to the counter circuit 270. In one embodiment, the scalable master clock 230 operates in a frequency range between 16 and 66 megahertz. In an exemplary embodiment, the scalable master clock 230 employs a phase locked loop that multiplies the frequency five or six times resulting in clock frequencies ranging from 330 to 396 megahertz. As discussed above with respect to FIG. 1, one skilled in the art may adjust the speed of the scalable master clock 230 depending on which circuit of a field-programmable gate array is being tested.

After the signal input 220 is conditioned and synchronized, the signal synchronization circuit 210 provides a signal to both the reference path 240 and the response path 250. The reference path 240 is located from a point A to a point B, and is associated with a first delay of a first portion of a field-programmable gate array. In the illustrated embodiment, the first portion may be a circuit portion of a field-programmable gate array that provides a reference delay, which is then used to determine a relative delay for other portions of the field-programmable gate array. As discussed previously with respect to FIG. 1, the reference path 240 may include any appropriate portion of the field-programmable gate array.

The reference path 240 is a first input for the logic device 260. As the first input, the reference path 240 is configured to provide an event initiation marker for opening a delay measurement window. A second input for the logic device 260 is provided by the response path 250. The response path 250 is a second path of the integrated delay discriminator 200 that is located from the point A to a point C and is associated with a second delay of a second portion of the field-programmable gate array. In the illustrated embodiment, the logic device 260 is a XOR gate. In other embodiments the logic device 260 may be other devices, which may include a NOR gate, a NAND gate or a combination of other logic devices.

As previously mentioned, the response path 250 is the second input for the logic device 260. As the second input, the response path 250 provides an event termination marker for closing the delay measurement window that was opened by the reference path 240. The output of the logic device 260, as controlled by the reference path 240 and the response path 250, provides the delay measurement window by which a time delay determination measurement between the first portion and the second portion may be attained. The logic device 260 in the form of the XOR gate provides an asserted or high level when one of its inputs is not asserted thereby delineating the delay measurement window. The delay measurement window is more fully discussed below with respect to FIG. 3.

In the illustrated embodiment, the time delay determination measurement represents the actual delay time of the second portion since the first portion has a negligible delay. In other embodiments, however, the time delay determination measurement may represent a relative delay between the second portion and the first portion of the field-programmable gate array. For example, the first portion may include circuits X and Y with associated known delays. The second portion, however, may include circuits X and Y with known delays and Z with an unknown delay. The delay of Z can be determined from the time delay determination measurement since the other delays are known. Accordingly, the first portion and the second portion may include any combination of circuits within the field-programmable gate array with known or unknown delays.

The output of the logic device 260 is coupled to the counter circuit 270. The counter circuit 270 is a conventional counter circuit associated with the display 280. The display 280 may be a conventional series of light emitting diodes that provide a visual output of the condition of the counter circuit 270. In the illustrated embodiment, the time delay determination measurement is proportional to a period of the scalable master clock 230. The counter circuit 270, therefore, determines the time delay determination measurement by counting the number of clock periods when the output of the logic device 260 or the delay measurement window is at the asserted or high level. The display 280 then provides a visual output of the time delay measurement window.

Turning now to FIG. 3, illustrated is a timing diagram of an embodiment of a method, generally designated 300, of determining a time delay of a circuit associated with a field-programmable gate array in accordance with the principles of the present invention. The timing diagram 300 includes waveforms of a master scalable clock, a reference path, a response path and a delay measurement window. The waveforms for the reference path and the response path may be representative of the point B and the point C of FIG. 2, respectively. The waveform for the delay measurement window may be the output of a logic device recorded at a point D of FIG. 2.

Before a time T1, the waveforms of the reference path, response path and delay measurement window are at a low level. At the time T1, a signal synchronization circuit initiates an event initiation marker by providing a signal at the point A (see FIG. 2), which is supplied to both the reference path and the response path. At this event, the waveforms of the reference path and the delay measurement window transition from a low level to a high level, and the waveform of the response path remains at a low level. In FIG. 3, the waveform of the delay measurement window represents an output of a conventional XOR gate with the reference path as a first input and the response path as a second input. When the waveform of the reference path transitions from a low level to a high level at the time T1, the waveform of the delay measurement window, therefore, also transitions to a high level.

Between the time T1 and a time T2, the waveforms of the reference path and the delay measurement window remain at a high level and the waveform of the response path remains at a low level. At the time T2, the signal provided the response path reaches the point C (see FIG. 2), and the waveform of the response path provides an event termination marker when it transitions to a high level. As discussed above, the response path is the second input of the XOR gate. When the response path transitions to a high level, both the first and second inputs of the XOR gate are asserted, and the corresponding output transitions from a high level to a low level thereby closing the delay measurement window. As discussed above with respect to FIG. 2, the delay measurement window is then used to provide a time delay determination measurement between the event initiation and the event termination markers.

Although the present invention has been described in detail, those skilled in the art should understand that they can make various changes, substitutions and alterations herein without departing from the spirit and scope of the invention in its broadest form.

What is claimed is:

1. A method of determining a signal delay associated with a field-programmable gate array, comprising:

providing in the field-programmable gate array a reference path having first and second ends, the reference path having a reference signal delay;

providing in the field-programmable gate array a response path having first and second ends, the response path having an unknown signal delay;

applying a signal to the first ends of the reference path and the response path;

opening a delay measurement window when the applied signal reaches the second end of the reference path;

closing the delay measurement window when the applied signal reaches the second end of the response path; and initiating a count of the applied signal's periods when the delay measurement window opens and terminating the count when the delay measurement window closes.

2. The method as recited in claim 1 wherein the applied signal is a clock signal.

3. The method as recited in claim 1 wherein the seconds ends of the reference and response paths are coupled to a logic device, the method including changing the state of the logic device in response to applied signals received from the reference and response paths.

4. The method as recited in claim 1 wherein providing the response path comprises configuring the response path within the field-programmable gate array.

5. The method as recited in claim 1 wherein providing the reference path comprises configuring the reference path within the field-programmable gate array.

6. A field-programmable gate array, comprising:

a reference path having first and second ends, the reference path having a reference signal delay;

a response path having a first and second ends, the first end coupled to the first end of the reference path, the response path having an unknown signal delay;

a signal source coupled to the first ends of the reference and response paths and operable to apply a signal to the reference and response paths;

a logic device coupled to the second ends of the reference and response paths and operable to change state in response to applied signals received from the reference and response paths; and a counter having an enable input terminal coupled to the logic device and a count input terminal coupled to the signal source, wherein the counter is enable by the logic device to count signal source periods when the device receives the applied signal from the reference path and is disabled by the logic device from counting signal source periods when the device receives the applied signal from the response path.

7. The field-programmable gate array as recited in claim 6 wherein the reference path and/or the response path are configurable.

8. The field-programmable gate array as recited in claim 6 wherein the signal source is a scalable master clock.

9. The field-programmable gate array as recited in claim 6 wherein the logic device is an XOR gate.

10. The field-programmable gate array as recited in claim 6 including a display coupled to the counter and operable to display a visual output of the condition of the counter.

* * * * *